United States Patent
Meier et al.

(10) Patent No.: US 9,748,936 B2
(45) Date of Patent: Aug. 29, 2017

(54) FREQUENCY GENERATOR, METHOD AND COMPUTER PROGRAM

(71) Applicant: Intel IP Corporation, Santa Clara, CA (US)

(72) Inventors: Stefan Meier, Neubiberg (DE); Lajos Gazsi, Duesseldorf (DE); Matthias Schoebinger, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 25 days.

(21) Appl. No.: 14/861,056

(22) Filed: Sep. 22, 2015

(65) Prior Publication Data

US 2016/0182026 A1    Jun. 23, 2016

(30) Foreign Application Priority Data

Dec. 19, 2014   (DE) .......................... 10 2014 119 285

(51) Int. Cl.
| | |
|---|---|
| *H03K 5/12* | (2006.01) |
| *H03K 5/1252* | (2006.01) |
| *H04B 1/04* | (2006.01) |
| *H04B 1/16* | (2006.01) |

(52) U.S. Cl.
CPC ............. *H03K 5/1252* (2013.01); *H04B 1/04* (2013.01); *H04B 1/16* (2013.01)

(58) Field of Classification Search
CPC combination set(s) only.
See application file for complete search history.

(56) References Cited

U.S. PATENT DOCUMENTS

| | | | | |
|---|---|---|---|---|
| 2003/0216906 | A1* | 11/2003 | Norsworthy | H04B 1/04 704/10 |
| 2006/0152396 | A1* | 7/2006 | Wegner | H03F 3/217 341/143 |
| 2006/0158359 | A1* | 7/2006 | Magrath | H03M 7/302 341/143 |
| 2011/0143689 | A1* | 6/2011 | Ballantyne | H03B 19/00 455/75 |
| 2011/0241919 | A1* | 10/2011 | Alderson | G06F 1/02 341/143 |

\* cited by examiner

*Primary Examiner* — Junpeng Chen
(74) *Attorney, Agent, or Firm* — Eschweiler & Potashnik, LLC

(57) ABSTRACT

Embodiments relate to a frequency generator. The frequency generator comprises a quantization device configured to synthesize a carrier signal with a desired frequency characterized by a series of phase transitions at desired time instants, by approximating a phase transition at a desired time instant with a phase transition at a quantized effective time instant. The frequency generator further comprises a noise shaper configured to provide a noise-shaped feedback signal using the desired time instant and the effective time instant. Moreover, the frequency generator comprises an error generator configured to cause an error component within the effective time instant, the error component being at least 50 percent of a temporal quantization unit.

16 Claims, 10 Drawing Sheets

FREQUENCY GENERATOR, METHOD AND COMPUTER PROGRAM

REFERENCE TO RELATED APPLICATION

This application claims priority to German Application number 10 2014 119 285.0 filed on Dec. 19, 2014, the contents of which are incorporated by reference in their entirety.

FIELD

Embodiments of the present invention relate to a frequency generator, a method and a computer program.

BACKGROUND

Current wireless transceivers often need a large number of oscillators (NCOs) due to requirements of multi-channel-, multi-carrier- and multi-band-specifications. The challenges of multiple required coils and possible unwanted coupling between oscillators and transmit frequencies moved digital carrier synthesis into the focus of state-of-the-art developments in frequency and carrier signal generation. Digital synthesis of a carrier frequency for a carrier signal from a reference frequency based on delay lines is one approach followed. This is done via a selection of various phase-shifted replicas from a limited number of possible phase-shifted replicas of the input signal. Due the limited number of replica a quantization error has to be accepted. This approach may result in periodicities, which are caused by a specific repetitive pattern of selection of a quantized frequency (also called tap selection). Those periodicities then may cause unwanted peaks (spurs) in a noise spectrum.

Methods using dithering are applying noise shapers optimized for quantization noise, and a processing of non-linearity in tap lines may not be capable of reducing the spurs sufficiently to meet current requirements for low-noise applications like RX-systems with 100 dBc carrier-to-noise requirements. Conventional solutions may improve spur-levels to −50 or −60 dBc, but this is still far away from the desired −100 dBc spur-levels that may for example be required for LTE-RX.

It is hence desirable to improve a concept for mitigating effects of noise-related spurs arising from a digital synthesis of a carrier signal.

BRIEF DESCRIPTION OF THE DRAWINGS

Some embodiments of frequency generators and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1A:
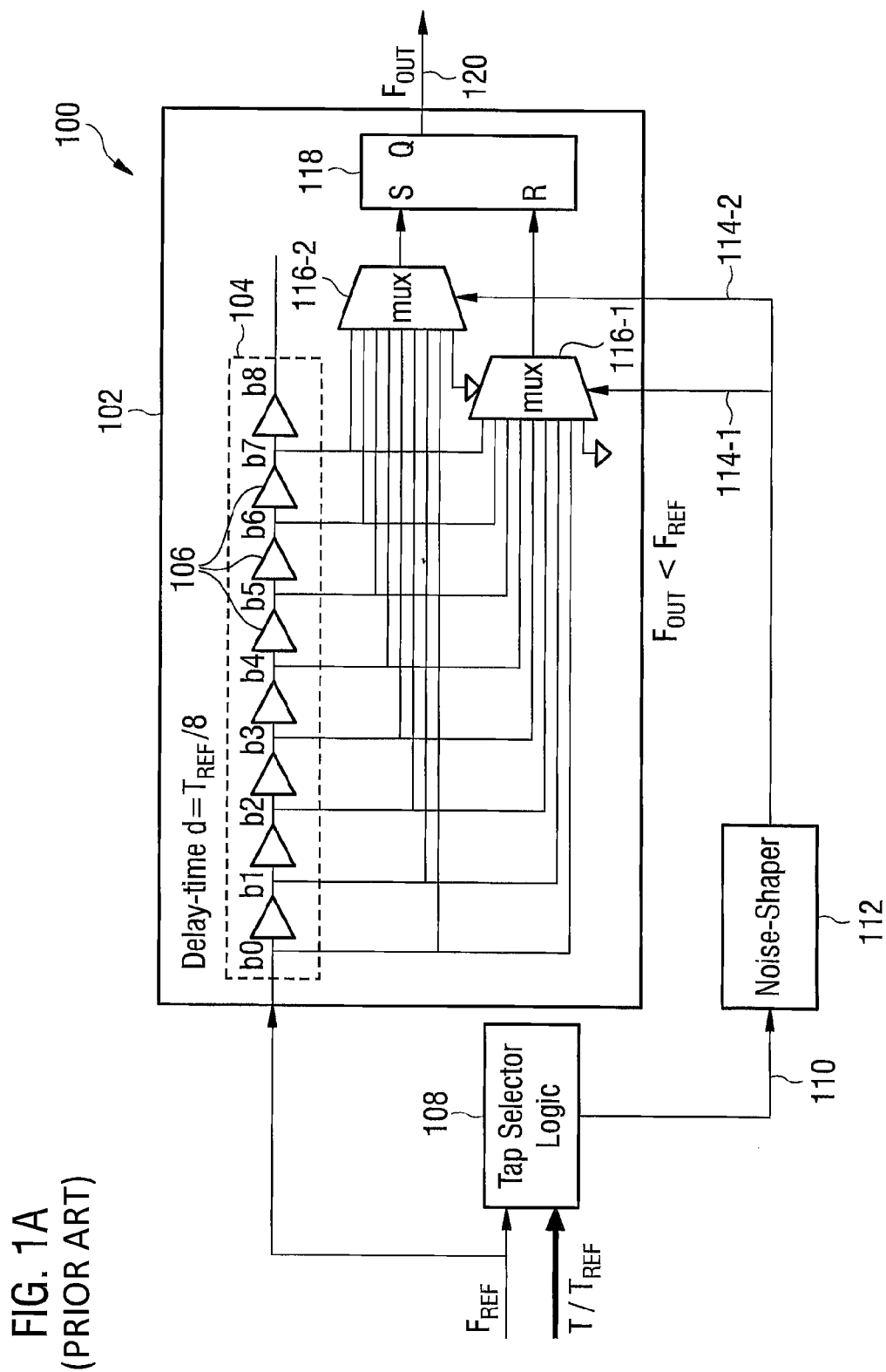
FIG. 1A shows a schematic diagram of a conventional circuit for digital carrier synthesis.

FIG. 1a shows a conventional radio-frequency (RF) transceiver 100 operable to perform a digital carrier synthesis. A reference oscillator generates a reference frequency $F_{REF}$, from which an arbitrary carrier frequency may be derived by a direct digital synthesis block 102. The reference frequency $F_{REF}$ is delayed multiple times in a delay line 104 comprising a predetermined number of delay elements 106. FIG. 1a shows eight delay elements 106, resulting in a delay time d corresponding to ⅛ of a reference time $T_{REF}$ inversely proportional to the reference frequency $F_{REF}$. A tap selector 108 is operable to generate a sequence for tap addressing, which is based on the quantization unit $T_{REF}/8$. In fact, quantization steps performed by the various delay elements 106 may deviate from this quantization unit, causing a non-linearity error if the sequence is executed. Tap selector 108 may provide the sequence as an input signal 110 for a noise shaper 112, the input signal 110 being based on the reference frequency $F_{REF}$ and a time parameter $T/T_{REF}$. Noise shaper 108 may alter the sequence for tap addressing, so that a noise floor arising from the quantization error corresponds to a desired spectral mask. Each delay element 106 in delay line 104 is coupled to a multiplexer 116-1 and 116-2, respectively. Multiplexer 116-1 is coupled to a reset interface R, and multiplexer 116-2 is coupled to a set interface S of a logic element, for instance a latch 118, which is designed as a set-reset (SR) flip-flop. By choosing a specific pattern of multiplexer address signals 114-1; 114-2 using noise shaper 112, the multiplexers are caused to provide output signals to latch 118. In other words, a required sequence of edges may be generated to form output signal 120 at frequency $F_{OUT}$, the rising edges of the synthesized carrier signal being provided by multiplexer 116-2, and the falling edges by multiplexer 116-1, respectively. Output signal 120 may either be directly provided or used as a signal to control the multiplexers 116-1; 116-2. Since, however, the number of delay elements 106 is limited, an ideal edge position may only be approximated due to the inherent quantization and may be subject to quantization errors and deviations caused by mismatch and non-linearity.

Figure 1B:
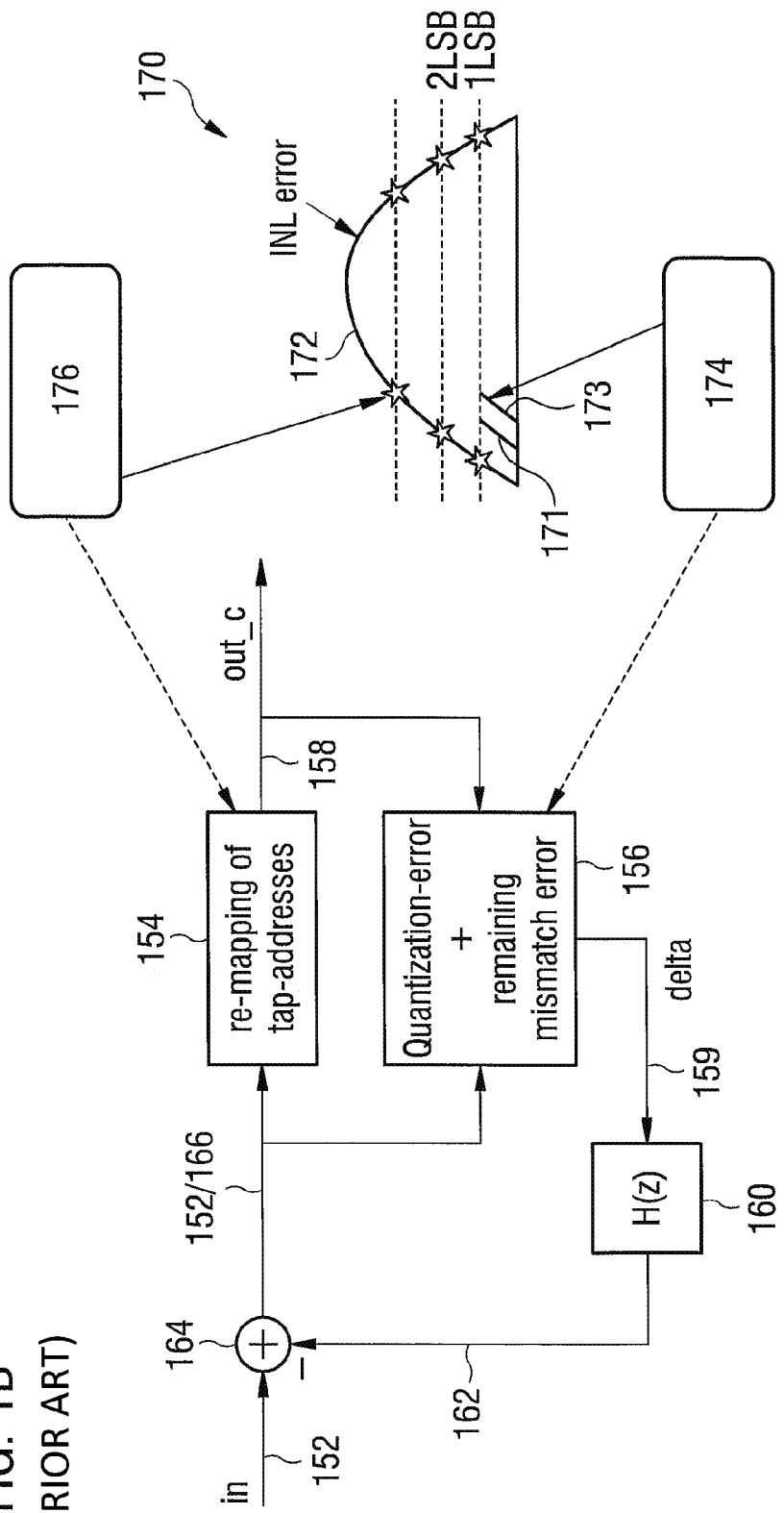
FIG. 1B shows a schematic diagram of a conventional frequency generator for handling quantization and non-linearity in time-domain.

The influence of these deviations may conventionally be reduced by remapping, as presented in FIG. 1b. An input signal 152 indicating a desired edge-position is provided to a decision unit 154 and a first signal adder 156. Decision unit 154 performs a mapping or re-mapping of tap addresses and provides an output signal 158 indicating an effective edge-position, which may be provided at an output interface and/or be received by the first signal adder 156. That is, the effective edge-position is the edge-position presently provided. The first signal adder 156 calculates a difference of the effective edge-position indicated by output signal 158 and the desired edge-position indicated by input signal 152, which corresponds to an effective error (labeled "delta"). The effective error comprises a quantization error and a remaining mismatch error (which may start with a value equal to zero before a first iteration is completed), and provides an error signal 159 (delta) to a noise shaper 160. Noise shaper 160 performs an operation H(z) to provide a noise-shaped feedback signal 162 to a second signal adder 164. The second signal adder 164 is configured to calculate a sum of input signal 152 and feedback signal 162 and to provide a modified input signal 166 to decision unit 154 and the first signal adder 156 in a second and subsequent iteration steps. Decision unit 154 performs a re-mapping of tap addresses to provide output signal 158. In the next iteration, the first signal adder 156 provides the now recalculated error signal 159 (delta) to noise shaper 160. Noise shaper 160 is, in other words, configured to mitigate error contributions within the spectrum caused by quantization in time domain. Using the assembly shown in FIG. 1b, it is attempted to reduce or possibly to minimize the effective error.

A principle of re-mapping in case of a mismatch processing to consider non-ideal delays within the synthesis block 102 performed by decision unit 154 is visualized in a graphic 170, showing a course of an integral non-linearity (INL) error 172. The error may result from a difference between a quantization step 171 between 1 LSB and 2 LSB and another quantization step 173 between 2 LSB and 3 LSB. A tap address is corrected if the quantized effective edge-position of output signal 158 exhibits a deviation (resembled by the INL error 172) of more than ½ of a least significant bit (LSB) from an ideal tap position 176 determined by a desired edge-position of input signal 152 or modified input signal 166. A final distance 174 between the ideal and an effective tap position corresponds to the effective error comprising the quantization error and remaining mismatch error calculated by the first signal adder 156.

Conventionally, to minimize overall error energy, the remapping may be done in a way that for each required tap-position the closest mismatched tap is used.

In many cases, peaks in a noise spectrum or spurs are originating from a periodicity in a sequence of tap addresses. To some extent, smearing of the spurs may be performed by the noise shaper, as it may be shown by comparing a performance of the noise shaper with second and third order, however, this smearing effect may be limited and not all spurs may be reduced in magnitude as it may be desirable to fit into a given specification mask.

Figure 2A:
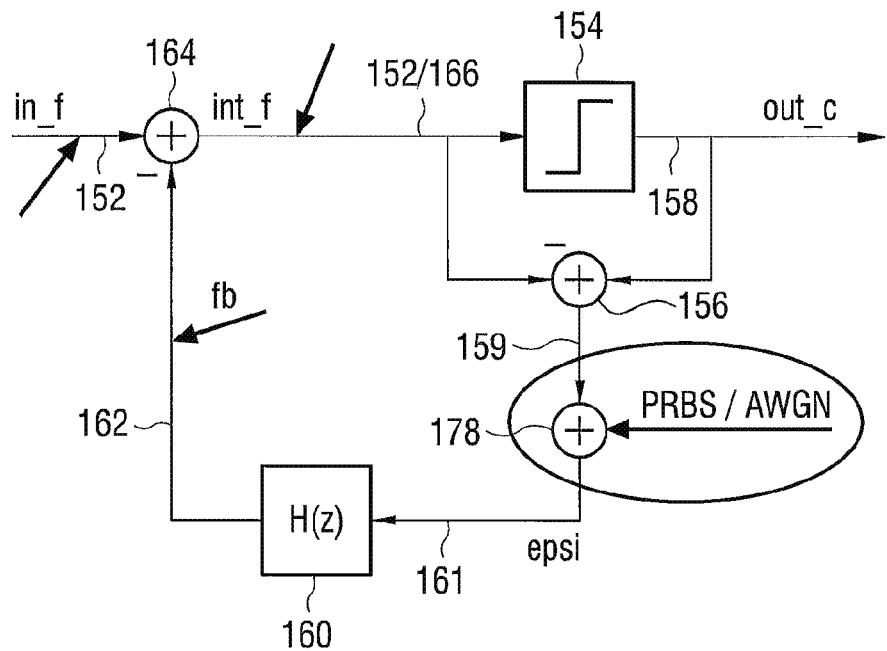
FIG. 2A shows a schematic diagram of a conventional frequency generator for handling quantization with conventional dithering.

A conventional approach of dithering is illustrated in FIG. 2a assuming a case were noise shaping is used to handle quantization errors only. It is shown a circuitry resembling the one in FIG. 1b, wherein components corresponding to like components in FIG. 1b are not explained again. In the following section, differences to FIG. 1b are rather lined out.

Dithering is performed by adding an error contribution to the error signal 159 with a third signal adder 178, which may be determined using a distribution like a pseudo-random binary sequence (PRBS) or an additive white Gaussian noise (AWGN). In principal the dithering is applied to error signal 159 resulting in an altered error signal 161 (epsi) as shown in FIG. 2a. Alternatively, dithering may be applied at feedback signal 162 (fb), input signal 152 (in_f) or modified input signal 166 (int_f) as marked by arrows.

To boost the smearing effect of the noise shaper, it may be possible to increase the order of the noise shaper, or to try to increase the error contribution inside the noise shaper (error signal 159 in FIG. 1b). An implementation of dithering may possibly lead to unsatisfying results, as a conventional dithering approach may give rise to increasing noise-floors with only minor influence onto smearing of the spurs.

Embodiments are based on the principle of compensating non-linearities of a digital-to-time conversion (DTC) by trading a higher noise outside a required band versus reduced spur-magnitude levels in a frequency band of interest. These noise contributions in the desired frequency band may then be at least partially eliminated by the noise-shaper more easily, and the band of interest may comprise significantly less spurs.

An exemplary approach comprises using a tap other than the closest tap, and using a tap selection pattern which breaks undesired periodicities, thus possibly resulting in lower spur-magnitude levels. This may be equivalent to creating a specific noise with a non-Gaussian distribution directly in the quantization block or its correspondent.

Figure 2B:
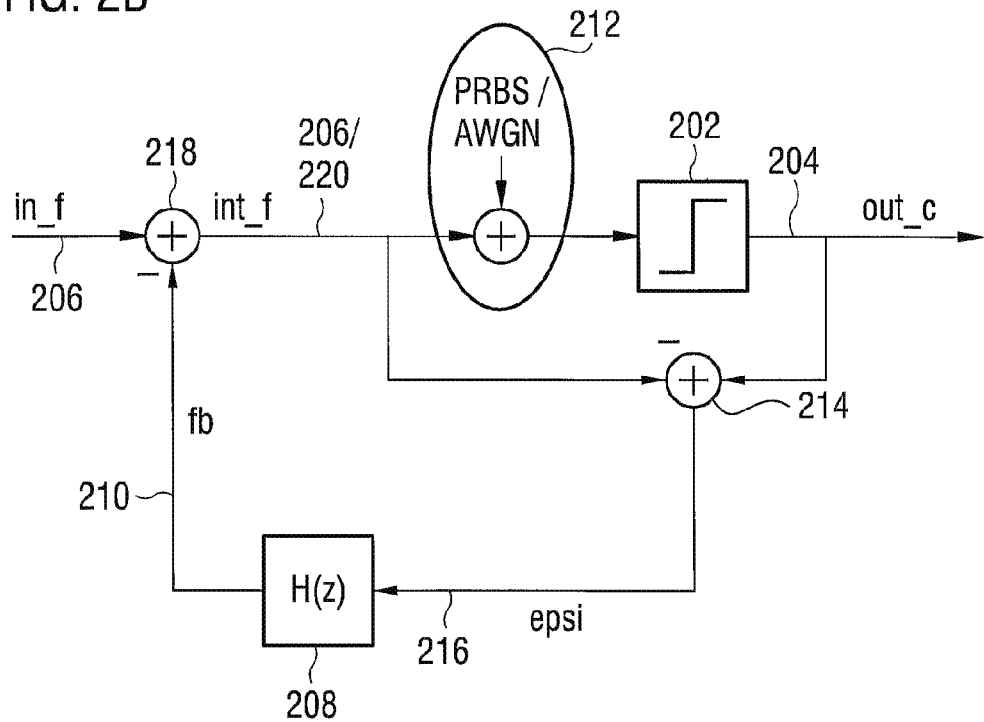
FIG. 2B shows a schematic diagram of a frequency generator according to an embodiment.

In other words, one embodiment relates to a manipulation of a decision device, which is depicted by FIG. 2b. It is shown a frequency generator 200. The frequency generator 200 comprises a quantization device 202 configured to synthesize a carrier signal with a desired frequency characterized by a series of phase transitions at desired time instants 206, by approximating a phase transition at a desired time instant 206 with a phase transition at an effective time instant 204. A time interval between two subsequent phase transitions is given by an integer number of temporal quantization units. The frequency generator 200 further comprises a noise shaper 208 configured to provide a noise-shaped feedback signal 210 using the desired time instant 206 and the effective time instant 204. Moreover, the frequency generator 200 comprises an error generator 212 configured to cause an error component within the effective time instant 204, the error component being at least 50 percent of a temporal quantization unit. This may have the effect that a local maximum of a noise component within the carrier signal resulting from a periodicity of a quantization error caused by the quantization device 202 is attenuated. Spurs in the noise spectrum that may occur in a frequency band used for communications may thus be reduced. In other words, a decision process in the quantization device 202 is manipulated by altering the desired time instant value 206 before being provided to quantization device 202 and after providing the desired time instant value 206 to a signal adder 214. Signal adder 214 is configured to calculate a difference between the effective time instant value 204 and the desired time instant value 206. An error signal 216 (epsi) based on said difference is then provided to noise shaper 208 by signal adder 214.

In other words, frequency generator 200 may enable generating a carrier signal having an effective frequency by approximating a desired frequency. This may be achieved by shifting phase transitions in time. The effective frequency therein may be time-variant, e.g. the carrier signal may be a modulated signal. In other words, a signal is created at the required frequency (comprising some temporary deviations which could also be called modulation).

In contrast to the conventional solution revisited in FIG. 1b, in embodiments the error generator is configured to increase a quantization error or an effective error to at least 50 percent of a temporal quantization unit or at least ½ LSB. Thus, it may become possible to attenuate spur effects in a frequency band of interest.

By this approach, for example a decision for a phase transition at an effective time instant 204 for the approximation of the phase transition at the desired time instant 206 is manipulated directly in quantization device 202. In embodiments referring to digital signal processing, a signal may exhibit a rectangular shape, and the effective time instant 204 of the phase transition may correspond to a point in time for an edge position. In other applications the signal may for example have a sine shape, and the effective time instant 204 may be a time interval. In other words, the desired time instant value 206 received by quantization device 202 differs from the desired time instant value 206 received by signal adder 214, since the former is altered by insertion of the error component, whereas the latter is not. This way it may become possible to attenuate an error arising from quantization using noise shaper 208. The error component added by error generator 212 may in one embodiment be determined using a PRBS- or AWGN-like distribution. Error generator 212 may thus be configured to apply dithering to the representation of the desired time instant value 206, which is provided to quantization device 202.

In some embodiments, noise shaper 208 is configured to provide the noise-shaped feedback signal 210 using a difference between the effective time instant 204 and the desired time instant 206. Furthermore, in some embodiments frequency generator 200 comprises a first signal adder 218 (denominated in the following as feedback signal adder 218) to subtract the noise-shaped feedback signal from the desired time instant value 206 and thus provide a modified desired time instant value 220. Thus, an iterative process may be enabled, which may cause an output of different effective time instant values that change according to a predetermined pattern. This pattern may be periodic. By following the exemplary approach, the periodicity may be significantly different from a periodicity resulting from a conventional approach. According to the presented approach, spurs resulting from said periodicity may thus be attenuated.

In some embodiments quantization device 202 is configured to synthesize the carrier signal with an effective frequency by approximating the phase transition at modified desired time instant value 220 with a phase transition at the effective time instant. Noise shaper 208 is therein configured to provide the noise-shaped feedback signal 210 using the modified desired time instant value 220 and the effective time instant value 204. This may in other words resemble a second or any subsequent iteration step within the aforementioned iteration process.

Figure 2C:
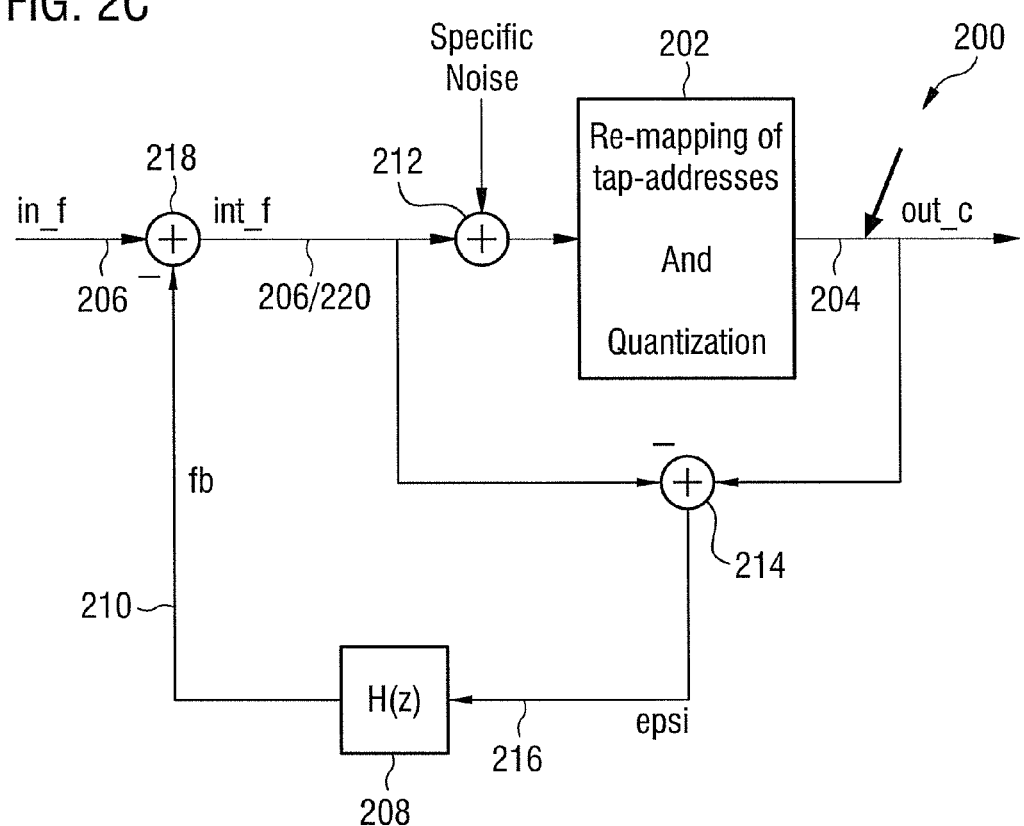
FIG. 2C shows a schematic diagram of a frequency generator according to another embodiment.

Another embodiment is displayed in FIG. 2c. Components corresponding to those in FIG. 2b are not explained again here, however, differences between the respective embodiments are lined out. In case of quantization errors and non-linearity errors the quantization device 202 may be configured to perform a remapping of taps (which may automatically include the quantization process), as is demonstrated in FIG. 2c. As the remapping of the taps is realized in most cases based on look-up tables and the implementation of these tables may consider that noise shaper 208 is operating at the carrier signal frequency (f_out) (for example around 2 GHz for some LTE-bands), an approach of dividing functionality in separate tables and removing signal adder 214 computing the error signal 216 (epsi) may lead to an approach with two tables, as originally presented in FIG. 1b. This splitting into two tables is optional and may lead to an ease of implementation.

Classical dithering may use pseudo-random sequences of bits for LSBs or might use AWGN-like contributions for some LSBs. For a smearing of spurs, error sequences that are not equally distributed and do not have a distribution like white noise may improve results. That is to say, the error component may be determined using a non-Gaussian and non-equally distributed Gaussian noise. In some embodiments, a first error value within the error distribution has a lower probability than a second error value larger than the first error value. Thus, the error distribution may have a somewhat higher probability for bigger values than for small values. This specific noise is added by error generator 212 in FIG. 2c, before the desired time instant value 206 (or the modified desired time instant value 220) is received by quantization device 202.

Figure 3:
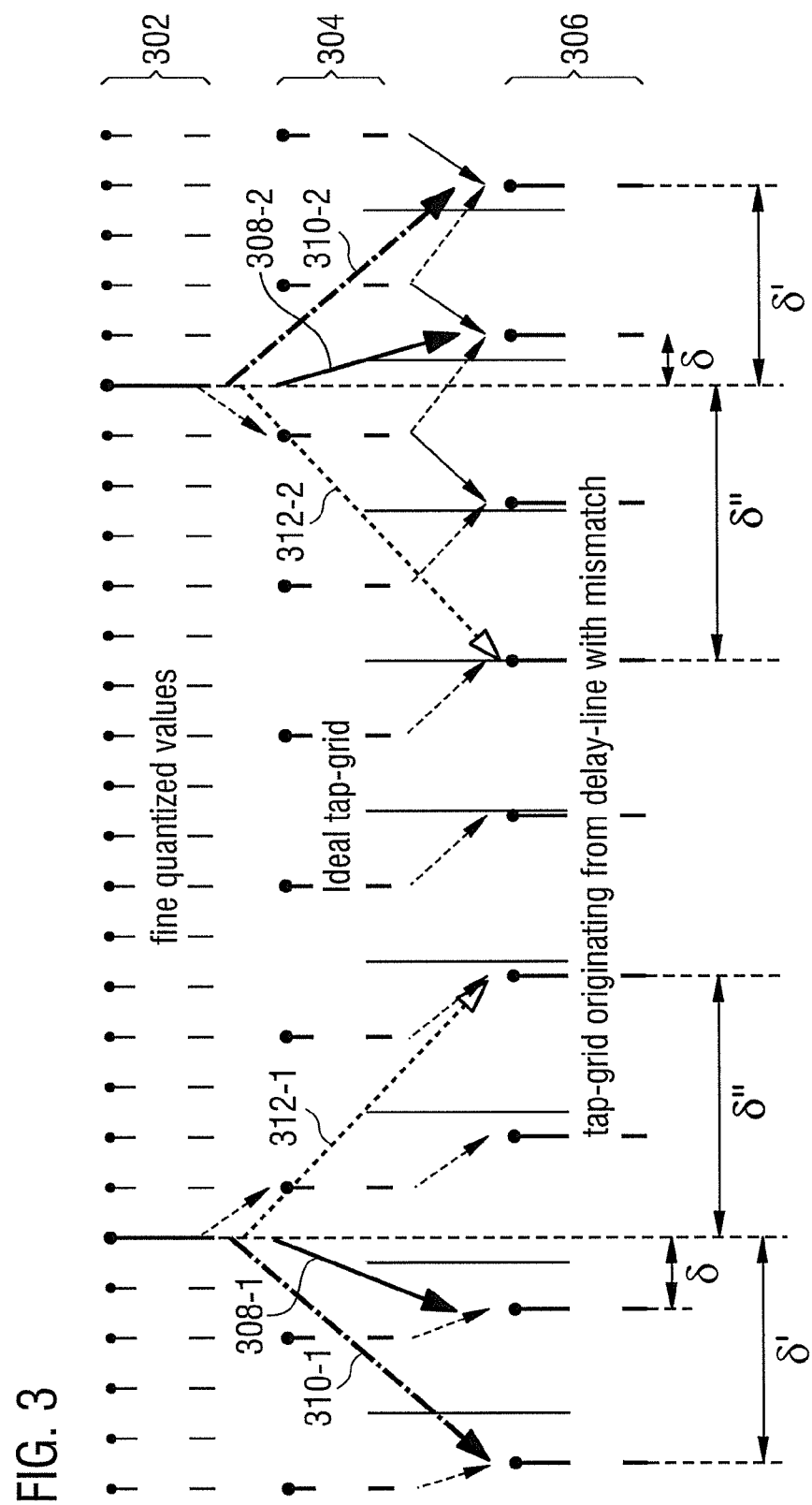
FIG. 3 shows a selection scheme for a quantized time interval between two subsequent phase transitions according to an embodiment.

As an alternative approach to classical dithering by adding an additional sequence, the selection of the tap in the remapping process may be modified as displayed in FIG. 3. In an exemplary constellation the decision from fine quantized values 302 to an ideal tap-grid 304 and further to a tap-grid 306 degraded by non-linearity the task of finding the closest tap is visualized (short dotted arrows and short solid arrows). Tap grid 306 originates from the delay line (also compare FIG. 1a), and may be subject to mismatch. The original approach of finding the closest tap is represented by bold arrows 308-1; 308-2 delivering an error of δ.

In some embodiments, the error generator is configured to provide the error component using a sum of an offset value and a quantization error. Dash-dotted arrows 310-1; 310-2 symbolize the modified approach of choosing a tap one step (or one quantization unit) further away than the closest tap. This approach is denominated "round+1", with the quantization error originating from rounding and the offset value equaling +1, and produces an error contribution of δ'. In some embodiments this increased error emerges in the remapping-table as well as in the computation of the remaining error. This way, increased error energy may be corrected in its shape.

Further approaches with increased error magnitudes are available. In some embodiments, the offset value corresponds to one in a group comprising one quantization unit and two quantization units. The latter is denominated "round+2" for a choice of a tap two steps further away than the closest tap. The offset value may in another embodiment correspond to any other integer multiple of the quantization unit. In some further embodiments, the quantization device optionally is configured to approximate the phase transition at the desired time instant by selecting one in a group comprising a closest match and a second-closest match for the desired time instant value. The closest match corresponds to a rounding to the closest integer value (denominated "round"). The second-closest match corresponds to a rounding in an opposite direction (denominated "antiround"). The error generator is further configured to apply the offset value to the selected approximation. In one embodiment, which is visualized by bold dashed arrows 312-1; 312-2, and which is denominated "antiround+1", the second-closest match is chosen and the offset value equals +1. In this case, an error contribution of δ" is produced. In another embodiment, denominated "antiround+2", the offset value may correspond to +2. The explained approaches deliver an error contribution different from Gaussian or equally distributed sequences as discussed above.

Figure 4:
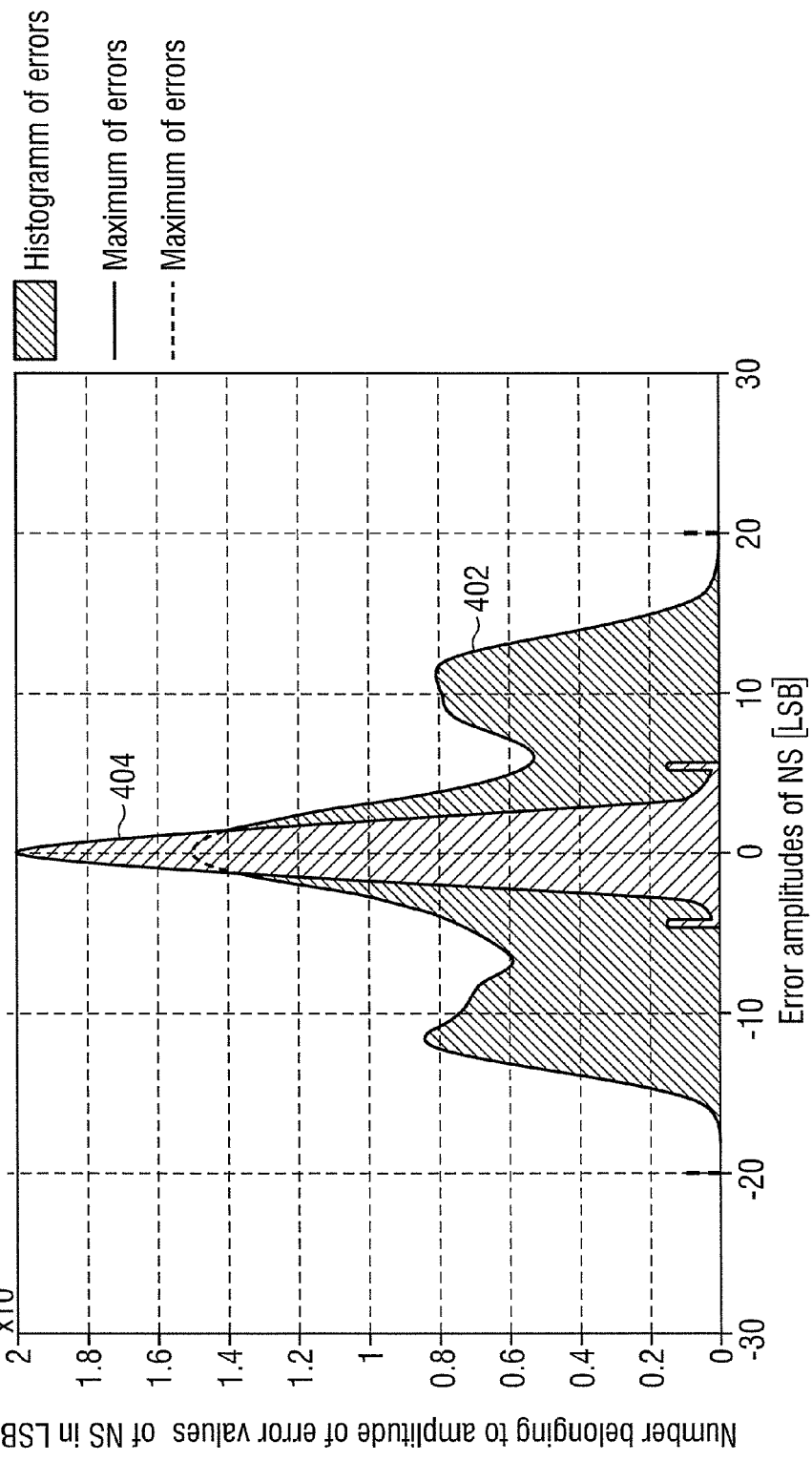
FIG. 4 shows a histogram of an error contribution resulting from a selection of a quantized time interval between two subsequent phase transitions according to an embodiment.

For reasons of clarity of this approach, FIG. 4 illustrates in a histogram a range 402 that the values of the error component (e.g. δ") in FIG. 3 may assume with a modified selection approach compared to a range 404 following a minimum-error-selection approach. The x-axis displays error amplitudes of noise shaping in LSB, and the y-axis displays a number representing the rate of occurrence of the amplitude of error values of noise shaping in LSB. In both cases the values of the error amplitudes are normalized to LSBs of the tap-line (1≙1*(tap delay)). This range may be significantly larger than the errors itself, as the errors 'excite' the noise-shaper. FIG. 4 and FIG. 5 are resulting from simulations with a tap selection following the "antiround+1" approach (bold dashed arrows 312-1; 312-2 in FIG. 3). It is one finding of range 402 FIG. 4, that the error components δ" exhibit a non-Gaussian and non-linear distribution.

In some embodiments the frequency generator is further configured to approximate the phase transition at the modified desired time instant with a phase transition at a further effective time instant given by an integer number of quantization units after a finite number of iteration steps. The finite number follows a probability distribution depending on the error component. The range 402 of values of the error component shown in FIG. 4 may thus have an influence on the probability distribution. In a further embodiment, a median of the probability distribution may remain unchanged therein.

Figure 5A:
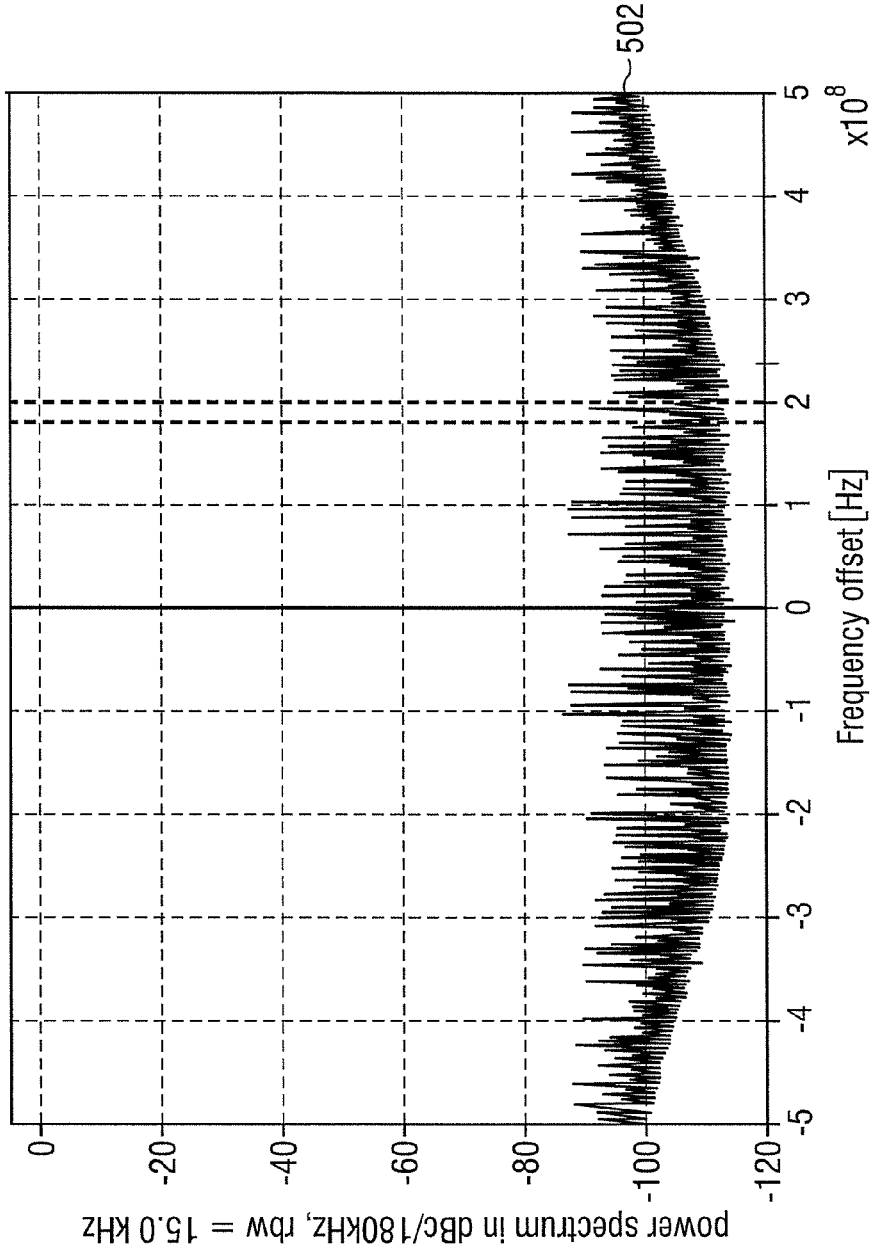
FIGS. 5A and B show a comparison of spectra resulting from a conventional selection of a quantized time interval between two subsequent phase transitions and a selection according to an embodiment.
Figure 5B:
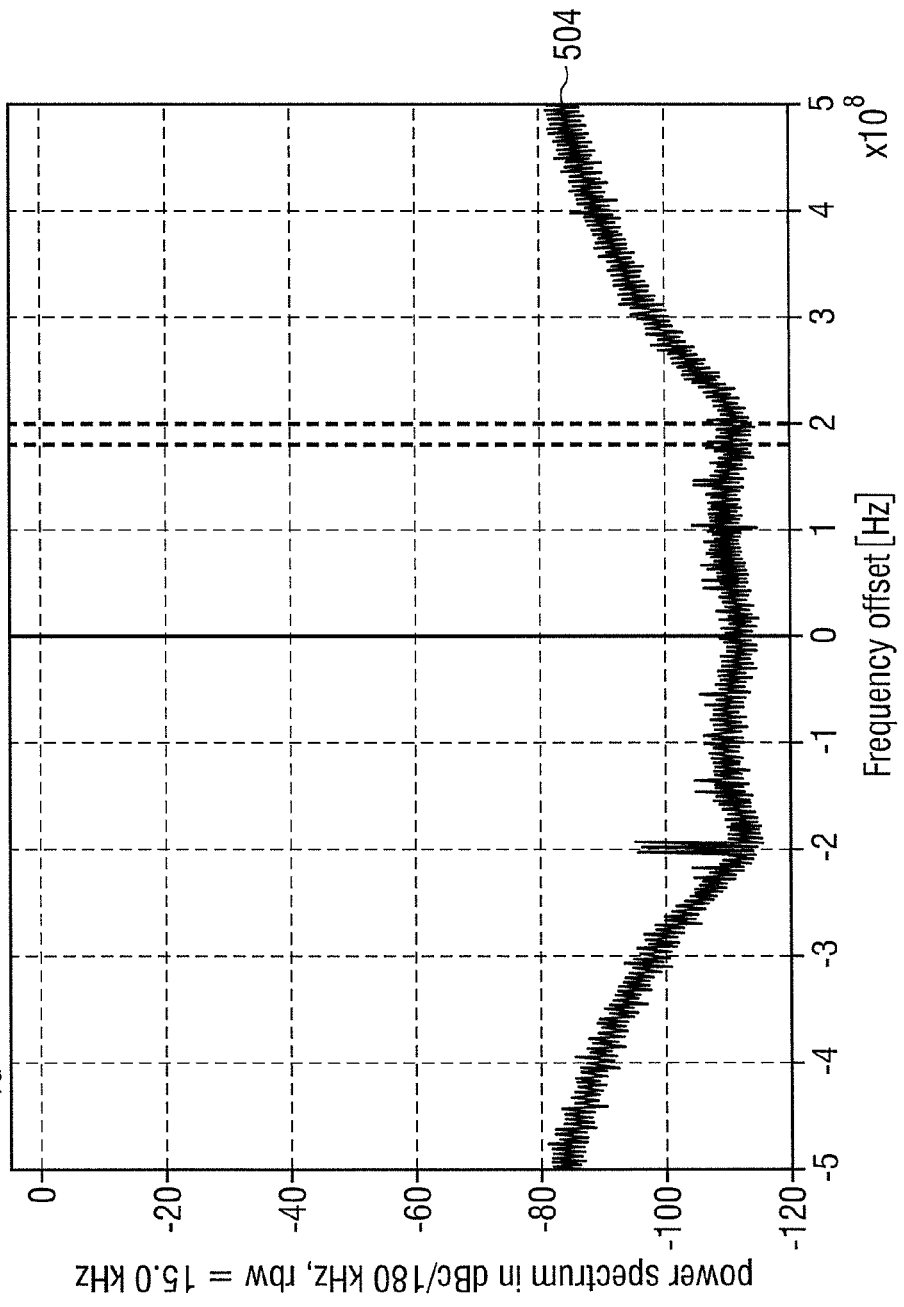

Turning now to FIGS. 5a and 5b, the performance of the presented approaches for tap-selection is demonstrated with algorithm-level MatLab simulations covering scenarios with different reference frequencies and various carrier frequencies $F_{out}$. In FIG. 5a a spectrum 502 for the closest-tap selection and in FIG. 5b a spectrum 504 for modified tap selection according to embodiments is presented. The x-axis displays a frequency offset in Hz, and the y-axis displays a power spectrum in dBc/180 kHz. Comparing FIGS. 5a and 5b, a reduction of spur-magnitudes and also spur energy is clearly visible in spectrum 504. Spectrum 504 also exhibits an increase of a noise floor outside the bands of interest for a given channel.

The implementation of the remapping and the computation of the remaining error may be implemented as look-up tables for the nearest tap selection. For the modified selection addressed in embodiments the implementation may comprise an additional programming of content into the look-up-tables. Therein, an increase of complexity of the tables may be avoided. In some embodiments, two tables may be used, which may simplify an implementation at a higher sample rate.

Figure 6A:
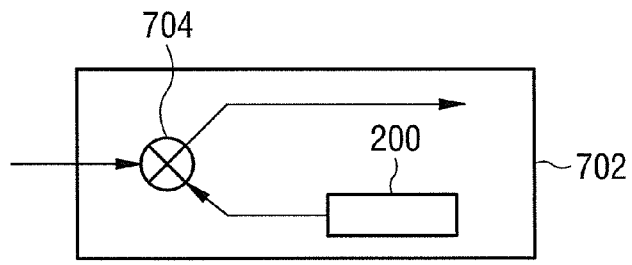
FIG. 6A shows a receiver according to an embodiment.
Figure 6B:
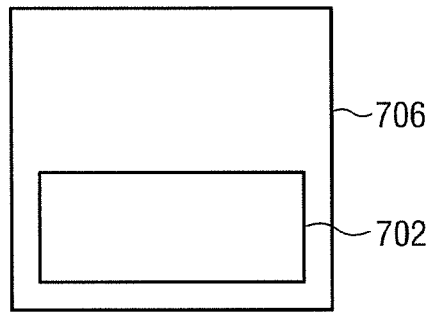
FIG. 6B shows a transceiver according to an embodiment.
Figure 6C:
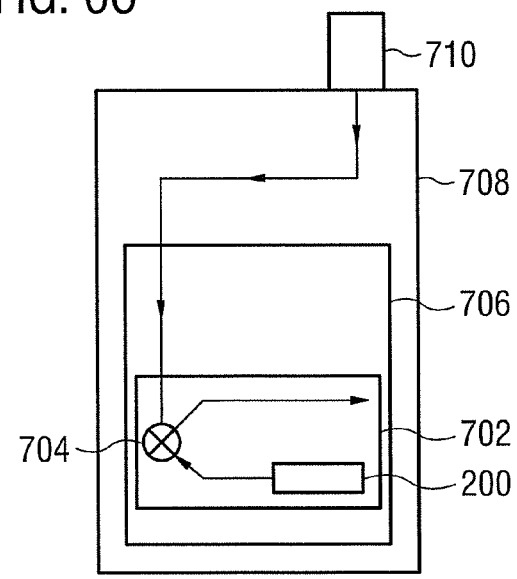
FIG. 6C shows a mobile communication device according to an embodiment.

In some further embodiments, as is shown in FIG. 6a, frequency generator 200 may be comprised by a receiver 702. Receiver 702 may further comprise a downmixer 704 for mixing the synthesized carrier signal. Downmixer 704 may receive an incoming signal, which is mixed with the synthesized carrier signal, and provide a downmixed baseband signal. FIG. 6b shows a transceiver 706 according to a further embodiment comprising receiver 702. Moreover, in another further embodiment shown in FIG. 6c, a mobile communication device 708 comprises transceiver 706 and a receiving interface 710 coupled to receiver 702. The receiving interface 710 is configured to receive an incoming signal using the carrier frequency. In some embodiments, the mobile communication device is further configured to combine a carrier signal with the carrier frequency and a further carrier signal in a carrier aggregation scenario. This may increase user data rates across a given cell coverage area. The implementation of frequency generator 200 in a receiver, however, is merely to be understood as an exemplary embodiment. Frequency generator 200 may also be comprised e.g. by a transmitter.

Explained again in other words, embodiments refer to a means for generating a frequency. The means for generating a frequency comprises a means for quantization configured to synthesize a carrier signal with a desired frequency characterized by a series of phase transitions at desired time instants, by approximating a phase transition at a desired time instant with a phase transition at an effective time instant, wherein a time interval between two subsequent phase transitions is given by an integer number of temporal quantization units. The means for generating a frequency further comprises a means for noise shaping configured to provide a noise-shaped feedback signal using the desired time instant and the effective time instant. The means for generating a frequency also comprises a means for error generation configured to cause an error component within the effective time instant. The error component is at least 50 percent of a temporal quantization unit. Thus a local maximum of a noise component within the carrier signal resulting from a periodicity of a quantization error caused by the means for quantization may be attenuated. In some embodiments the error component is determined using a non-Gaussian and non-equally distributed error distribution.

Figure 7:
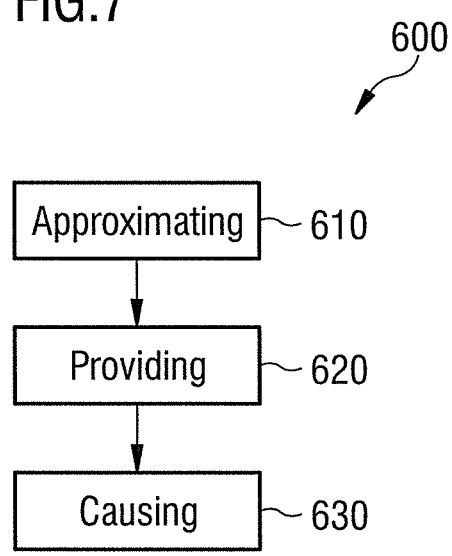
FIG. 7 shows a block diagram for a method for providing a carrier signal according to an embodiment.

FIG. 7 shows a flow chart of a method 600 for synthesizing a carrier signal with a desired frequency characterized by a series of phase transitions at desired time instants. The method 600 comprises an approximating 610 of a phase transition at a desired time instant with a phase transition at an effective time instant. Therein, a time interval between two subsequent phase transitions is given by an integer number of temporal quantization units. The method 600 further comprises a providing 620 of a noise-shaped feedback signal using the desired time instant and the effective time instant. Moreover, the method 600 comprises a causing 630 of an error component within the effective time instant, the error component being at least 50 percent of a temporal quantization unit. This way, a local maximum of a noise component within the carrier signal resulting from a periodicity of a quantization error caused by the quantization device may be attenuated.

Some embodiments comprise a digital control circuit installed within the frequency generator for performing the method. Such a digital control circuit, e.g. a digital signal processor (DSP), needs to be programmed accordingly. Hence, yet further embodiments also provide a computer program having a program code for performing embodiments of the method, when the computer program is executed on a computer or a digital processor.

Some embodiments may make use of a non-uniform and non-Gaussian distribution like the round+x and antiround+x approaches. Furthermore, the distribution may be broader than a Gaussian distribution and have side-maxima, as shown in FIG. 4, and a relation, for example based on a correlation $E(error^4)/E(error^2)^2$, may be more pronounced than for a Gaussian distribution. Smearing or randomization of spurs may work for INL-based error contributions as well as for quantization errors and for combinations of INL and quantization errors. The antiround approach may be realized by a simple implementation in the tables and may avoid building noise generators. Other noise sources with the properties of higher probabilities of larger values than for smaller values may present a further approach. In some embodiments, a deterministic behavior of "antiround" may not be essential, as the smearing is performed by the noise shaping process. In further embodiments, a "stimulation" of the noise-shaping process with larger errors than normal may lead to more randomization of the spurs. Therefore distributions like the one generated by round+x or antiround+x may attenuate noise effects even further. Alternatively, other similar artificial random errors may be used. Different round+x or antiround+x approaches may deliver similar spectral results and may exhibit slightly different tradeoffs in smearing of spurs and out-of-band noise. A position of a notch in frequency-domain may be determined by H(z) in noise-shapers in a multitude of cases. A modification of the H(z) coefficients or the content of the tables may represent another embodiment to adopt to various requirements for different bands or different carrier-aggregation scenarios. By adding a specific distribution of errors into the quantization/remapping-block it my become possible to reach the −100 dBc goal for LTE.

Modifying the nearest tap selection may reduce the magnitude of spurs in digital carrier-synthesis at the expense of increased noise-level outside the band. An implementation is possible for example by different programming of the lookup-tables used in earlier versions with nearest tap selection.

Simulation results (FIGS. 5a and b) show lower spur energy and a reduced number of remaining spur positions, thus meeting the −100 dBc requirements. It is to be understood that embodiments described above merely have an exemplary character. An implementation in other applications, where a tradeoff between spur-level and noise-floor is permissible, i.e. applications more sensitive to spur than to general noise-floor, may be possible in other embodiments. Some more embodiments may comprise further strategies of increasing the error while simultaneously shaping it. Embodiments may be used in combination with a RC carrier-generation, and may reduce a number of required NCOs with coils, or in combination with a TX-carrier-generation in cases of carrier-generation only, where a modulation may not be necessary. Embodiments may enable a RX-carrier-generation with a 100 dBc carrier-to-spur requirement and may be implemented in a carrier aggregation scenario.

Example 1 is a frequency generator comprising a quantization device configured to synthesize a carrier signal with a desired frequency characterized by a series of phase transitions at desired time instants, by approximating a phase transition at a desired time instant with a phase transition at a quantized effective time instant; a noise shaper configured to provide a noise-shaped feedback signal using the desired time instant and the effective time instant; and an error generator configured to cause an error component within the effective time instant, the error component being at least 50 percent of a temporal quantization unit.

In example 2, the quantization device of example 1 is configured to synthesize the carrier signal with the desired frequency characterized by the series of phase transitions. A time interval between two subsequent phase transitions is given by an integer number of temporal quantization units.

In example 3, in the frequency generator of any of the preceding examples, the error component is determined using a non-Gaussian and non-equally distributed error distribution.

In example 4, in the frequency generator of example 3, a first error value within the error distribution has a lower probability than a second error value larger than the first error value.

In example 5, in the frequency generator of any of the preceding examples, the error generator is configured to provide the error component using a sum of an offset value and a quantization error.

In example 6, the quantization device of example 5 is configured to approximate the phase transition at the desired time instant by selecting one in a group comprising a closest match and a second-closest match for the desired time instant. The error generator of example 5 is configured to apply the offset value to the selected effective time instant.

In example 7, in the frequency generator of example 5 or 6, the offset value corresponds to an integer multiple of quantization units or to one in a group comprising one quantization unit and two quantization units.

In example 8, the noise shaper of any of the preceding examples is configured to provide the noise-shaped feedback signal using a difference between the effective time instant and the desired time instant.

In example 9, the frequency generator of any of the preceding examples further comprises a first signal adder configured to subtract the noise-shaped feedback signal from the desired time instant value, and to provide a modified desired time instant value as an input to the quantization device in a subsequent iteration step.

In example 10, the frequency generator of example 9 is further configured to approximate a phase transition at the modified desired time instant with a phase transition at a further effective time instant given by an integer number of quantization units after a finite number of iteration steps. The finite number follows a probability distribution depending on the error component.

Example 11 is a transmitter comprising a frequency generator of any of the preceding examples, and a signal mixer for mixing the synthesized carrier signal.

Example 12 is a receiver comprising a frequency generator of any of the preceding examples, and a downmixer for mixing the synthesized carrier signal.

Example 13 is a transceiver comprising a receiver of example 12.

Example 14 is a mobile communication device comprising a transceiver of example 13 and a receiving interface coupled to the receiver. The receiving interface is configured to receive an incoming signal using the carrier frequency.

In example 15, the mobile communication device of example 14 is further configured to combine a carrier signal with the carrier frequency and a further carrier signal in a carrier aggregation scenario.

Example 16 is a means for generating a frequency comprising a means for quantization configured to synthesize a carrier signal with a desired frequency characterized by a series of phase transitions at desired time instants, by approximating a phase transition at a desired time instant with a phase transition at a quantized effective time instant; means for noise shaping configured to provide a noise-shaped feedback signal using the desired time instant and the effective time instant; and means for error generation configured to cause an error component within the effective time instant, the error component being at least 50 percent of a temporal quantization unit.

In example 17, in the means for generating a frequency of example 16, the error component is determined using a non-Gaussian and non-equally distributed error distribution.

Example 18 is a method for synthesizing a carrier signal with a desired frequency characterized by a series of phase transitions at desired time instants, comprising: approximating a phase transition at a desired time instant with a phase transition at an effective time instant; providing a noise-shaped feedback signal using the desired time instant and the effective time instant; and causing an error component within the effective time instant, the error component being at least 50 percent of a temporal quantization unit.

Example 19 is a computer program having a program code for performing the method of example 18, when the computer program is executed on a computer or processor.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Functional blocks denoted as "means for . . . " (performing a certain function) shall be understood as functional blocks comprising circuitry that is adapted for performing a certain function, respectively. Hence, a "means for s.th." may as well be understood as a "means being adapted or suited for s.th.". A means being adapted for performing a certain function does, hence, not imply that such means necessarily is performing said function (at a given time instant).

Functions of various elements shown in the figures, including any functional blocks labeled as "means", "means for quantizing", "means for noise shaping", "means for generating", etc., may be provided through the use of dedicated hardware, such as "a quantizer", "a noise shaper", "a generator", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons. Furthermore, in some embodiments a single step may include or may be broken into multiple sub steps. Such sub steps may be included and part of the disclosure of this single step unless explicitly excluded.

The invention claimed is:

1. A frequency generator comprising:
a quantization circuit configured to synthesize a carrier signal with a desired frequency characterized by a series of phase transitions at desired time instants, by approximating a phase transition at a desired time instant with a phase transition at a quantized effective time instant, wherein the phase transition at the quantized effective time instant is an output of the quantization circuit;
a noise shaper circuit configured to provide a noise-shaped feedback signal using the desired time instant and the quantized effective time instant; and
an error generator circuit configured to cause an error component within a time instant of a phase of a signal provided as an input to the quantizer circuit, wherein the error component is at least 50 per cent of a temporal quantization unit of the quantizer circuit, and
wherein the error component is determined using a non-Gaussian and non-equally distributed error distribution.

2. The frequency generator according to claim 1, wherein the quantization circuit is configured to synthesize the carrier signal with the desired frequency characterized by the series of phase transitions, wherein a time interval between two subsequent phase transitions is given by an integer number of temporal quantization units.

3. The frequency generator according to claim 1, wherein a first error value within the error distribution has a lower probability than a second error value larger than the first error value.

4. The frequency generator according to claim 1, wherein the noise shaper is configured to provide the noise-shaped feedback signal using a difference between the effective time instant and the desired time instant.

5. The frequency generator according to claim 1, further comprising a first signal adder configured to subtract the noise-shaped feedback signal from the desired time instant value, and to provide a modified desired time instant value as an input to the quantization circuit in a subsequent iteration step.

6. The frequency generator according to claim 5, further configured to approximate a phase transition at the modified desired time instant with a phase transition at a further effective time instant given by an integer number of quantization units after a finite number of iteration steps, wherein the finite number follows a probability distribution depending on the error component.

7. A transmitter comprising a frequency generator according to claim 1, and a signal mixer for mixing the synthesized carrier signal.

8. A receiver comprising a frequency generator according to claim 1, and a downmixer for mixing the synthesized carrier signal.

9. A mobile communication device comprising a transceiver according to claim 1 and a receiving interface coupled to the receiver, wherein the receiving interface is configured to receive an incoming signal using a carrier frequency.

10. A mobile communication device according to claim 9, further configured to combine a carrier signal with the carrier frequency and a further carrier signal in a carrier aggregation scenario.

11. A frequency generator comprising:
a quantization circuit configured to synthesize a carrier signal with a desired frequency characterized by a series of phase transitions at desired time instants, by approximating a phase transition at a desired time instant with a phase transition at a quantized effective time instant, wherein the phase transition at the quantized effective time instant is an output of the quantization circuit;
a noise shaper circuit configured to provide a noise-shaped feedback signal using the desired time instant and the quantized effective time instant; and
an error generator circuit configured to cause an error component within a time instant of a phase of a signal provided as an input to the quantizer circuit,
wherein the error generator is configured to provide the error component using a sum of an offset value and a quantization error.

12. The frequency generator according to claim 11, wherein:
the quantization circuit is configured to approximate the phase transition at the desired time instant by selecting one in a group comprising a closest match and a second-closest match for the desired time instant; and
wherein the error generator is configured to apply the offset value to a selected effective time instant.

13. The frequency generator according to claim 11, wherein the offset value corresponds to an integer multiple of quantization units or to one in a group comprising one quantization unit and two quantization units.

14. A means for generating a frequency comprising:
a means for quantization configured to synthesize a carrier signal with a desired frequency characterized by a series of phase transitions at desired time instants, by approximating a phase transition at a desired time instant with a phase transition at a quantized effective time instant, wherein the phase transition at the quantized effective time instant is an output of the means for quantization;
a means for noise shaping configured to provide a noise-shaped feedback signal using the desired time instant and the quantized effective time instant; and
a means for error generation configured to cause an error component within a time instant of a phase of a signal provided as an input to the means for quantization, wherein the error component is at least 50 per cent of a temporal quantization unit of the means for quantization,
wherein the error component is determined using a non-Gaussian and non-equally distributed error distribution.

15. A method for synthesizing a carrier signal with a desired frequency characterized by a series of phase transitions at desired time instants, the method comprising:
approximating a phase transition at a desired time instant of a signal input to a quantization circuit with a phase transition at an effective time instant of a signal output from the quantization circuit;
providing a noise-shaped feedback signal using the desired time instant and the effective time instant; and
causing an error component within a time instant of the signal input to the quantizer circuit, the error component being at least 50 per cent of a temporal quantization unit, and
wherein the error component is determined using a non-Gaussian and non-equally distributed error distribution.

16. A computer program having a program code stored on a non-transitory medium, the program code comprising instructions that when executed on a computer or processor performs a method for synthesizing a carrier signal with a desired frequency characterized by a series of phase transitions at desired time instants, comprising:
approximating a phase transition at a desired time instant of a signal input to a quantization circuit with a phase transition at an effective time instant of a signal output from the quantization circuit;

providing a noise-shaped feedback signal using the desired time instant and the effective time instant; and causing an error component within a time instant of the signal input to the quantizer circuit, the error component being at least 50 per cent of a temporal quantization unit, and wherein the error component is determined using a non-Gaussian and non-equally distributed error distribution.

* * * * *